(12) United States Patent
Kuo et al.

(10) Patent No.: US 12,293,974 B2
(45) Date of Patent: May 6, 2025

(54) PHOTONICS INTEGRATED CIRCUIT PACKAGE

(71) Applicant: Taiwan Semiconductor Manufacturing Company, Ltd., Hsinchu (TW)

(72) Inventors: Feng Wei Kuo, Hsinchu County (TW); Chewn-Pu Jou, Hsinchu (TW); Shuo-Mao Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/440,297

(22) Filed: Feb. 13, 2024

(65) Prior Publication Data
US 2024/0266296 A1    Aug. 8, 2024

Related U.S. Application Data

(60) Continuation of application No. 17/708,666, filed on Mar. 30, 2022, now Pat. No. 11,935,837, which is a
(Continued)

(51) Int. Cl.
*H01L 23/538*    (2006.01)
*G02B 6/42*    (2006.01)
(Continued)

(52) U.S. Cl.
CPC ........ *H01L 23/5386* (2013.01); *G02B 6/4202* (2013.01); *G02B 6/4251* (2013.01);
(Continued)

(58) Field of Classification Search
CPC .. G02B 6/12004; G02B 6/13; G02B 6/12026; G02B 6/122; G02B 6/30; G02B 6/1202; G02B 2006/12142
See application file for complete search history.

(56) References Cited

U.S. PATENT DOCUMENTS

| 10,535,597 B2 | 1/2020 | Chen et al. |
| 11,315,878 B2 | 4/2022 | Kuo et al. |

(Continued)

FOREIGN PATENT DOCUMENTS

| TW | 200703496 A | 1/2007 |
| TW | 201725408 A | 7/2017 |
| TW | 201826483 A | 7/2018 |

OTHER PUBLICATIONS

A.V. Krishnamoorthy, Optical interconnects in computing and switching systems: the anatomy of a 20Tbps switch card, 2018, all pages, International Solid-State Circuits Conference (ISSCC) 2018, Session 16, Institute of Electrical and Electronics Engineers.

*Primary Examiner* — Ryan A Lepisto
*Assistant Examiner* — Erin D Chiem
(74) *Attorney, Agent, or Firm* — Merchant & Gould P.C.

(57) ABSTRACT

An integrated circuit package integrates a photonic die (oDie) and an electronic die (eDie). More specifically, the integrated circuit package may include a plurality of redistribution layers communicatively coupled to at least one of the oDie and/or the eDie, where molded material at least partially surrounds the at least one of the oDie and/or the eDie.

20 Claims, 12 Drawing Sheets

Related U.S. Application Data division of application No. 16/654,679, filed on Oct. 16, 2019, now Pat. No. 11,315,878.

(60) Provisional application No. 62/753,537, filed on Oct. 31, 2018.

(51) Int. Cl.

| | |
|---|---|
| *H01L 21/48* | (2006.01) |
| *H01L 21/56* | (2006.01) |
| *H01L 21/683* | (2006.01) |
| *H01L 23/00* | (2006.01) |
| *H01L 23/31* | (2006.01) |
| *H01L 23/498* | (2006.01) |
| *H01L 25/00* | (2006.01) |
| *H01L 25/18* | (2023.01) |

(52) U.S. Cl.
CPC .......... *G02B 6/428* (2013.01); *H01L 21/4857* (2013.01); *H01L 21/486* (2013.01); *H01L 21/565* (2013.01); *H01L 21/568* (2013.01); *H01L 21/6835* (2013.01); *H01L 23/3128* (2013.01); *H01L 23/49816* (2013.01); *H01L 23/5384* (2013.01); *H01L 23/5385* (2013.01); *H01L 23/5389* (2013.01); *H01L 24/16* (2013.01); *H01L 24/19* (2013.01); *H01L 24/24* (2013.01); *H01L 24/73* (2013.01); *H01L 25/18* (2013.01); *H01L 25/50* (2013.01); *H01L 2221/68359* (2013.01); *H01L 2221/68372* (2013.01); *H01L 2224/16146* (2013.01); *H01L 2224/24137* (2013.01); *H01L 2224/73259* (2013.01); *H01L 2924/1431* (2013.01); *H01L 2924/1434* (2013.01)

(56) References Cited

U.S. PATENT DOCUMENTS

| | | |
|---|---|---|
| 11,531,171 B2 * | 12/2022 | Menezo ................ G02B 6/4206 |
| 11,935,837 B2 | 3/2024 | Kuo et al. |
| 2010/0215317 A1 | 8/2010 | Rolston et al. |
| 2012/0177381 A1 * | 7/2012 | Dobbelaere ....... H01L 23/49827 398/139 |
| 2017/0115458 A1 * | 4/2017 | Mekis ................. G02B 6/4208 |
| 2019/0121041 A1 * | 4/2019 | Albers ................ G02B 6/4232 |
| 2019/0146151 A1 * | 5/2019 | Meister .................... G02B 6/30 385/14 |

* cited by examiner

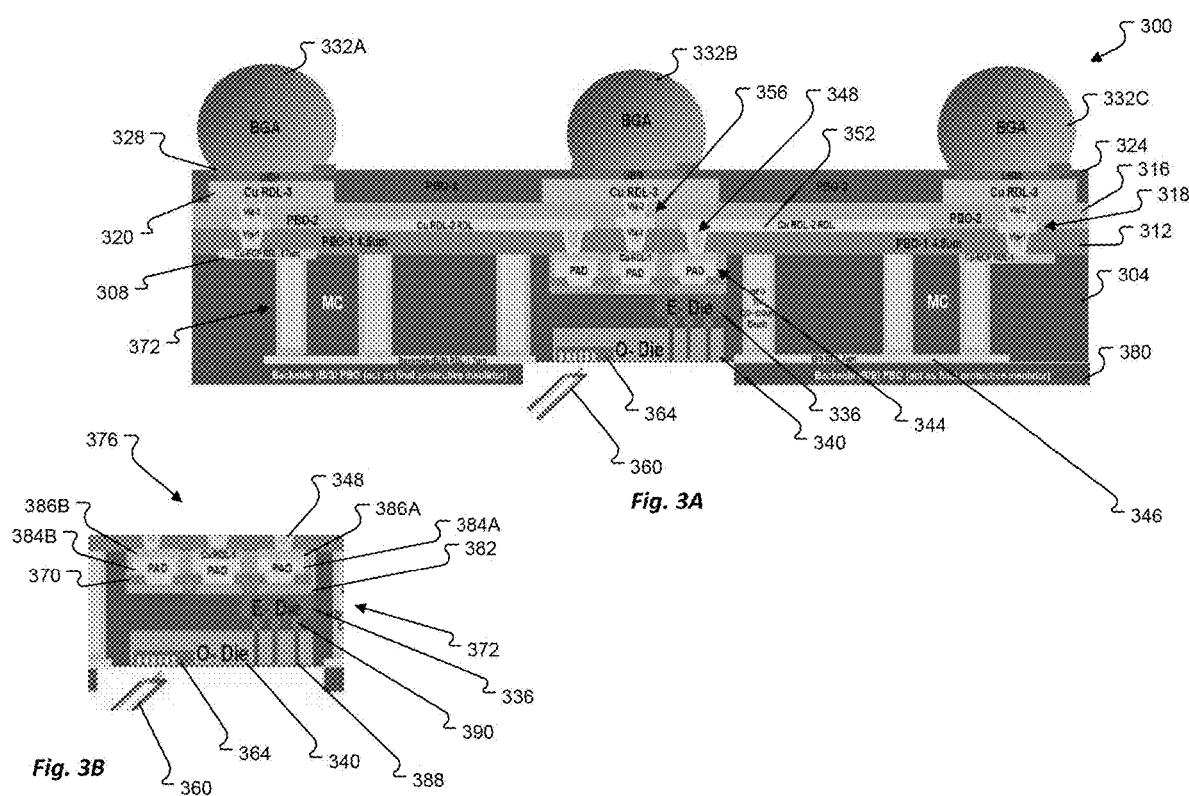

PHOTONICS INTEGRATED CIRCUIT PACKAGE

CROSS-REFERENCE TO RELATED APPLICATION(S)

This application is a continuation application of U.S. patent application Ser. No. 17/708,666, filed Mar. 30, 2022, which is a divisional application of U.S. patent application Ser. No. 16/654,679, filed Oct. 16, 2019, now U.S. Pat. No. 11,315,878, which claims the benefit of U.S. Provisional Application No. 62/753,537 entitled "PHOTONICS InFO PACKAGE," filed on Oct. 31, 2018, of which the entire disclosure are hereby incorporated by reference in their entirety.

BACKGROUND

Conventional packaging technologies generally include dicing a wafer and then packaging individual dies on the diced wafer. Because the individual dies are packaged after the wafer has been diced, the package size tends to be considerably larger than the die size. By contrast, in standard wafer level packaging techniques, integrated circuits are packaged while still part of the wafer, and the wafer is then diced afterwards. Accordingly, a resulting package is generally the same size as the die itself. However, the advantage of having a small package comes with a downside because the number of external contacts that can be accommodated in the limited package footprint are limited. In some instances, this may become a significant limitation when complex semiconductor devices requiring a large number of contacts are considered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B depict cross-sectional views of a third example of a photonic package in accordance with some embodiments;

DETAILED DESCRIPTION

Figure 1:
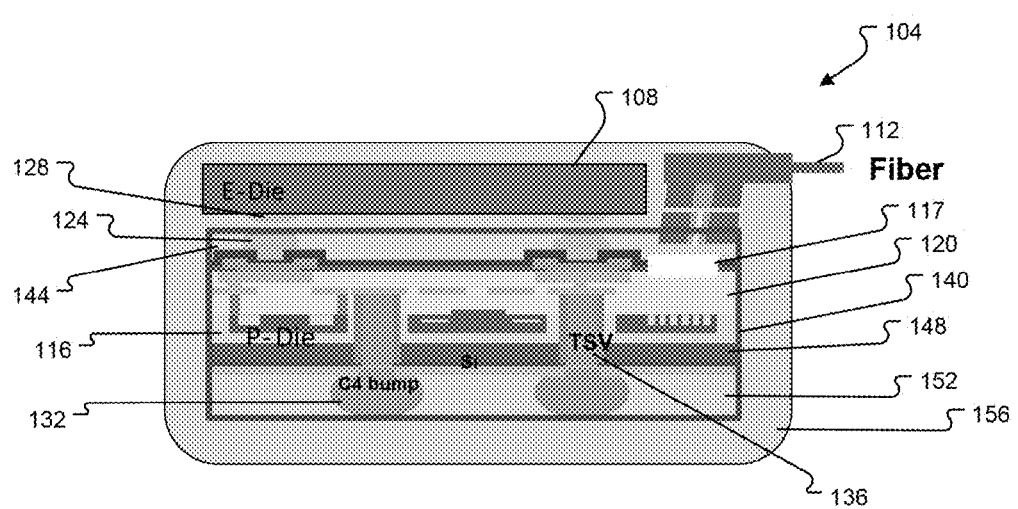
FIG. 1 depicts a cross-sectional view of a first example of a photonic package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When incorporating optical components such as lasers, optical modulators, optical detectors and optical switches into packaged electronic modules, conventional packaging and standard wafer level packaging techniques often may result in low density pin counts, larger form factors, and higher cost. For example, an integrated circuit may be affixed to an interposer, such as a Silicon interposer, via microbumps and then attached to a printed circuit board via a conductive glue. While a fiber array is situated on the interposer, a connection, power and/or data from the integrated circuit interfacing with the fiber array is routed from the microbumps to an external pad situated at the PCB by one or more traces within the interposer and a wire-bond connection. While wire-bonding can be cost effective and flexible, wire-bonding techniques may suffer reliability issues and often result in larger package sizes.

Multi-chip modules that include one or more optical modules may include an integrated circuit in communication with an optical module. In some instances, flip-chip packaging techniques may be employed such that an integrated circuit and an optical module are communicatively coupled to one another and attached to a substrate utilizing one or more bumps. In some instances, an interposer may reside between the integrated circuit and the optical module such that connections, such as connections coupled to the integrated circuit and/or the optical module and the substrate may be spread to a wider pitch and/or to reroute a connection to a different connection. In some instances the interposer may utilize through-silicon vias (TSVs) to connect the interposer to the substrate while the integrated circuit and the optical module may be attached to the interposer utilizing existing connection methods, such as bump connections. In some instances the interposer may be a photonic interposer for directing, and/or guiding, light from a light sources such as a laser, to another location in the package. Such multi-chip modules often have a larger form factor, higher cost, and are generally of a lower density and pin counts.

Embodiments described herein disclose advanced packaging techniques that integrate a photonic die (oDie) and an electronic die (eDie) into one package. In some instances, components in addition to the oDie and the eDie may be included in the package. For example, a package may include an oDie, an eDie, and a switch ASIC forming an interconnect package. The components of the eDie can include, but are not limited to, at least one of: one or more serializer/deserializers (serdes), one or more transceivers, clocking circuitry, and control logic and circuitry. The integration of the eDie with the switch ASIC can reduce the distance between the serdes and the switch logic, which in turn may reduce the size and the power consumption of the serdes. In some instances, through-silicon vias may be utilized in a substrate to electrically connect the various components. In other embodiments described herein, an oDie may be integrated with one or more additional photonic components in a single integrated circuit package. An eDie may then be attached to the integrated circuit package via one or more bumps.

As described herein, a package may utilize Integrated Fan-Out (InFO) technology to integrate multiple dies that may include photonic integrated circuit applications in to an integrated circuit package, also referred to as a wafer level package. Accordingly, an advanced package capable of handling high pin counts, e.g., having a high pin and component density, while having a small form factor can be achieved. Since InFO technology may be utilized, such packages may be highly integrated and may be less expensive to manufacture than traditional packaging techniques. The advanced package may be suitable for high-speed circuits.

InFO packaging technology differs from other packaging technology at least because fan-out packaging utilizes individual dies and embeds them in a material such as epoxy mold compound or other material with space allocated between each die for additional I/O connection points. Thus, the use of silicon real estate to accommodate higher pin counts can be avoided. Moreover, a redistribution layer may be utilized to route/re-route some I/O connections to periphery regions, further adds to higher package pin count density and contact utilization.

FIG. 1 depicts a cross-section view of a first package 104 in accordance with some embodiments of the present disclosure. More specifically the first package may utilize integrated circuit packaging techniques, such as InFO packaging techniques, and provide a fiber 112 coupled to an optical interconnect 117, where the optical interconnect 117 may specifically configured to receive light and provide the received light to an oDie 116 for further processing. That is, when light is received via a fiber at the first package 104, the first package 104 is configured to convert the light into electric signals. The one or more optical interconnects 117 may receive the light, and direct or guide the light via an optical waveguide to one or more detectors located at the oDie 116. The one or more detectors of the oDie 116 may detect and then convert the light into one or more corresponding electric signals. The one or more electric signals may flow through a redistribution layer 120, for example to the eDie 108, where the eDie 108 may further process the received one or more electric signals. The oDie 116 may be coupled to the eDie 108 via the redistribution layer 120 and one or more bumps, such as a microbump 124 of the oDie 116 and 128 of the eDie 108. The eDie 108 may process the one or more electric signals and provide one or more processed electric signals to a bump 132 via a redistribution layer 120 and a through silicon via 136 for connection to a printed circuit board of another die.

The first package 104 may include one or more portions. For example, the first package 104 may include the eDie 108, the fiber 112, and an oDie packaged portion 140. The oDie packaged portion 140 may include a first connection portion 144, one or more redistribution layers 120, one or more oDies 116, one or more Silicon layers 148, the one or more through silicon vias 136, and one or more second connection portions 152. The one or more first connection portions 144 may include one or more bumps 124 as previously discussed; the one or more second connection portions 152 may include the one or more bumps 132. The eDie 108, oDie packaged portion 140, and fiber 112 may be packaged in a protective material 156, where the one or more bumps 132 in the one or more second connection portion 152 may be exposed for connection to a printed circuit board, other die, and/or an external connections. For example, the first package 104 may be coupled to a log and/or memory.

Figures 2A, 2B:
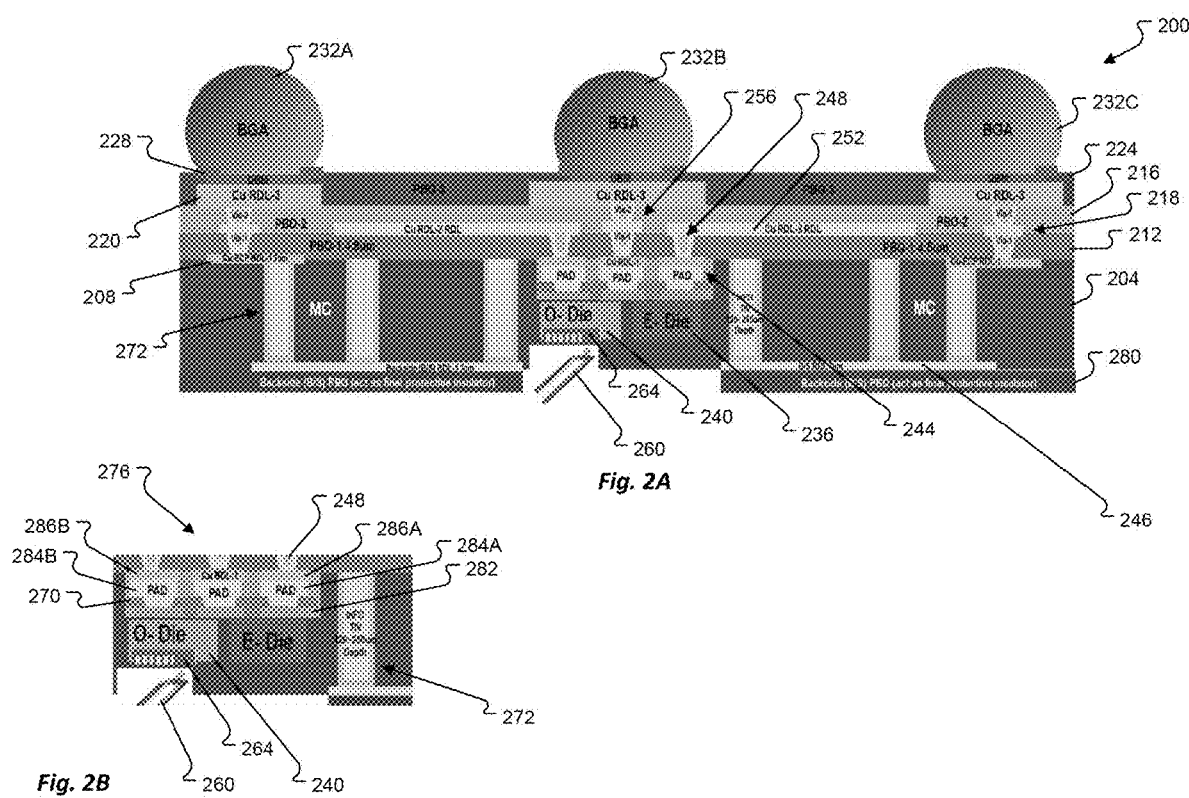
FIGS. 2A-2B depict cross-sectional views of a second example of a photonic package in accordance with some embodiments.

FIG. 2A depicts a cross-section view of second package 200 in accordance with embodiments of the present disclosure. FIG. 2B depicts an enlarged portion of the second package 200 depicted in FIG. 2A. Similar to the first package 104, the second package 200 may utilize integrated circuit packaging techniques, such as InFO packaging techniques. The second package may include a substrate 204. The substrate 204 may include a mold material, silicon material and/or other generally insulative or semiconductor material. The package 200 may include a protective layer 212 formed on top of, directly contacting, and/or disposed on the substrate 204. The protective layer 212 may include Polyimide and/or Polybenzoxazole material. The protective layer 212 may be a stress relief coating used as a protective layer or "buffer coat" before packaging or redistribution layer 252. Prior to the forming of the protective layer 212, one or more redistribution layers 208 may be formed on top, directly, contacting, and/or disposed on at least a portion of the substrate 204. Another protective layer 216 may be formed on at least a portion of the protective layer 212 and the redistribution layer 252. In some embodiments one or more vias 218 may be formed within the protective layers 216 and/or 212. In some instances, a first via may be formed after the formation of the first protective layer 212, while a second via may be formed after the formation of the second protective layer 216. Alternatively, or in addition, a first and/or second via may be formed after the protective layers 212 and 216 have been formed. For example, one or more portions of the protective layer 216 may be removed; for instance the one or more portions may be etched, drilled, or and/or exposed to light to form a first hole in the protective layers 212 and/or 216. An insulating material may then be placed within the first hole to line the sides of the hole. Finally, a conductive material may be placed in the hole thereby forming one or more vias 218.

The package 200 may include one or more redistribution layers 220 formed on, on top of, directly contacting, or otherwise disposed on the protective layer 216. In one embodiment, a protective layer 224 may be formed on, on top of, directly contacting, or otherwise disposed on the protective layer 216. One or more portions of the protective layer 224 may be removed. For example, the one or more portions may be etched, drilled, exposed to light etc., and thereby forming a hole in the protective layer 224. Then a redistribution layer 220 may be formed within the one or more holes of the redistribution layer 220. Lastly, one or more under bump metallization layers 228 may be formed on the redistribution layer 224; the one or more under bump metallization layers 228 may be configured to receive a sold ball and/or connector 232A-C to form a ball grid array for example.

As previously discussed the package 200 may include a redistribution layer 208; the redistribution layer 208 may provide a signal path from one or more of the optical dies (oDies) 240 and/or one or more eDies 236 via an interface portion 276 to one or more of the connectors 232A-232C. The connection portion 244 may include one or more of the redistribution layers 286A and/or 286B, one or more pads 284A and 284B, one or more conductive portions 270, and one or more insulative portions 282. A through integrated circuit package via or through insulator via (TIV) 272 may be formed in the substrate 204. The TIV 272 may couple the redistribution layer 208 to a backside redistribution layer 246 for example. The backside redistribution layer 246 may couple the redistribution layer 208 to one or more redistribution layers 252 for example. Accordingly, a via 248 coupling the redistribution layer 252 to one or more copper redistribution layers 286A and/or 286B may be formed. The redistribution layer 268A and/or 286B may be formed directly on, or otherwise disposed on a pad 284A and/or 284B. The pad 284A and/or 284B may be disposed within an insulative portion 282 including an insulating material; accordingly, one or more of the pads 284A and/or 284B may be coupled to the oDie and/or the eDie 236 via a connector portion 270.

As previously discussed an oDie 240 may be coupled to an optical interconnect 264 which may be configured to receive light from a fiber 260 and/or forward the light to a detector portion of the oDie 240. Thus, an opening may be exist at a fiber array receiving side of the package 200. The oDie 240 may convert the light into one or more electric signals and transmit or otherwise provide the one or more electric signals to the eDie 236 and/or an external connection, such as one or more of the connectors 232A-C. The one or more electric signals may be transmitted through the package 200 via one or more of the redistribution layers, the one or more vias, the one or more TIVs, one or more pads 284A and/or 286, and one or more connector portions 270.

In accordance with some embodiments of the present disclosure, the oDie 240 and the eDie 236 may reside within the package 200. For example, a cavity, hole, or other portion may be formed or otherwise exist in the substrate 204. Each of the one or more oDies 240 and/or the one or more eDies 236 may reside between TIVs on either side for example in a cross-section view. Further, the substrate material 204 may include or otherwise be an epoxy. In some embodiments, the oDie 240 and/or eDie 236 may be directly connected to or otherwise be disposed on one or more of the connector portions 270.

FIG. 3A depicts a cross-section view of a third package 300 in accordance with embodiments of the present disclosure. FIG. 3B depicts an enlarged portion of the third package 300 depicted in FIG. 3A. Similar to the first package 104 and the second package 200, the third package 300 may utilize integrated circuit packaging techniques. The third package may include a substrate 304. The substrate 304 may include a mold material, silicon material and/or other generally insulative or semiconductor material. The package 300 may include a protective layer 312 formed on top of, directly contacting, and/or disposed on the substrate 304. The protective layer 312 may include Polyimide and/or Polybenzoxazole material. The protective layer 312 may be a stress relief coatings used as a protective layer or "buffer coat" before packaging or redistribution layer 352. Prior to the forming of the protective layer 312, one or more redistribution layers 308 may be formed on top, directly, contacting, and/or disposed on at least a portion of the substrate 304. Another protective layer 316 may be formed on at least a portion of the protective layer 312 and the redistribution layer 352. In some embodiments, one or more vias 318 may be formed within the protective layers 316 and/or 312. In some instances, a first via may be formed after the formation of the first protective layer 312, while a second via may be formed after the formation of the second protective layer 316. Alternatively, or in addition, a first and/or second via may be formed after the protective layers 312 and 316 have been formed. For example, one or more portions of the protective layer 316 may be removed; for instance the one or more portions may be etched, drilled, or and/or exposed to light to form a first hole in the protective layers 312 and/or 316. An insulating material may then be placed within the first hole to line the sides of the hole. Finally, a conductive material may be placed in the hole thereby forming one or more vias 318.

The package 300 may include one or more redistribution layers 320 formed on, on top of, directly contacting, or otherwise disposed on the protective layer 316. In one embodiment, a protective layer 324 may be formed on, on top of, directly contacting, or otherwise disposed on the protective layer 316. One or more portions of the protective layer 324 may be removed. For example, the one or more portions may be etched, drilled, exposed to light etc., and thereby forming a hole in the protective layer 324. Then a redistribution layer 320 may be formed within the one or more holes of the redistribution layer 320. Lastly, one or more under bump metallization layers 328 may be formed on the redistribution layer 320; the one or more under bump metallization layers 328 may be configured to receive a sold ball and/or connector 332A-C to form a ball grid array for example.

As previously discussed the package 300 may include a redistribution layer 308; the redistribution layer 308 may provide a signal path from one or more of the optical dies (oDies) 340 and/or one or more eDies 336 via an interface portion 376 to one or more of the connectors 332A-332C. The connection portion 344 may include one or more of the redistribution layers 386A and/or 386B, one or more pads 384A and 384B, one or more conductive portions 370, and one or more insulative portions 382. A through integrated circuit package via (TIV) or through insulator via 372 may be formed in the substrate 304. The TIV 372 may couple the redistribution layer 308 to a backside redistribution layer 346 for example. The backside redistribution layer 346 may couple the redistribution layer 308 to one or more redistribution layers 352 for example. Accordingly, a via 348 coupling the redistribution layer 352 to one or more redistribution layers 386A and/or 386B may be formed. The redistribution layer 368A and/or 386B may be formed directly on, or otherwise disposed on a pad 384A and/or 384B. The pad 384A and/or 384B may be disposed within an insulative portion 382 including an insulating material; accordingly, one or more of the pads 384A and/or 384B may be coupled to the eDie 336 via a connector portion 370.

The oDie 340 may be coupled to an optical interconnect 364 which may be configured to receive light from a fiber 360 and/or forward the light to a detector portion of the oDie 340. Thus, an opening may be exist at a fiber array receiving side of the package 300. The oDie 340 may convert the light into one or more electric signals and transmit or otherwise provide the one or more electric signals to the eDie 336 and/or an external connection, such as one or more of the connectors 332A-C. The one or more electric signals may be transmitted through the package 300 via one or more of the redistribution layers, the one or more vias, the one or more TIVs, one or more pads 384A and/or 386, and one or more connector portions 370.

In accordance with some embodiments of the present disclosure, the oDie 340 and the eDie 336 may reside within the package 300. For example, a cavity, hole, or other portion may be formed or otherwise exist in the substrate 304. Each of the one or more oDies 340 and/or the one or more eDies 336 may reside between TIVs on either side for example in a cross-section view. Further, the substrate material 304 may include or otherwise be an epoxy such that the substrate material may be between one or more of the eDies 336, the oDies 340 and the one or more TIVs. In some embodiments, the eDie 336 may be directly connected to or otherwise be disposed on one or more of the connector portions 370 and the insulative portion 382.

As further depicted in FIGS. 3A-3B, the eDie 336 may be located between the oDie 340 and the insulative portion 382. Accordingly, the oDie 340 may be coupled to the eDie 336 via one or more vias 388 and one or more bumps 390. In accordance with at least one example, the oDie 340 may be flip-chip bonded to the eDie 346 while the package 300 employs integrated circuit packaging technologies.

Figure 4A:
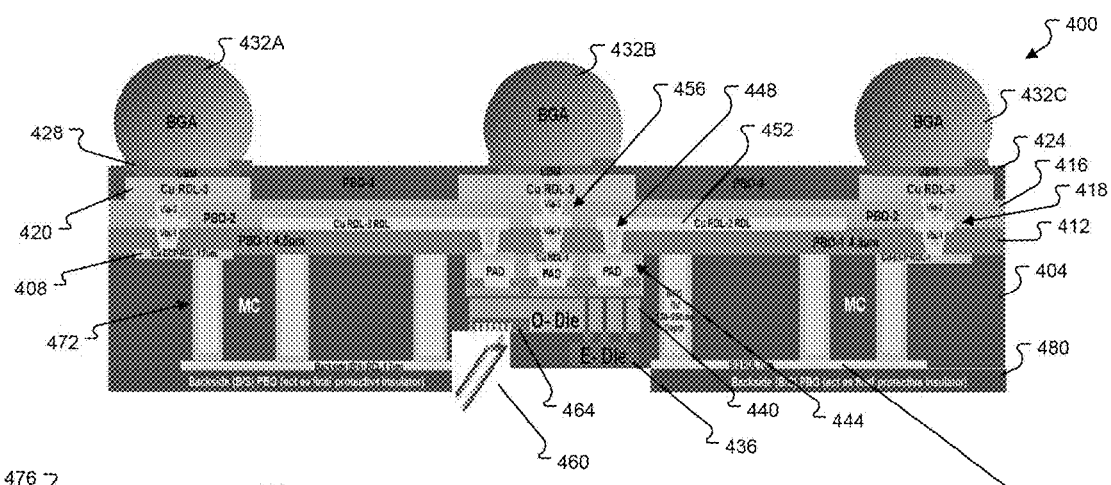
FIGS. 4A-4B. depict cross-sectional views of a fourth example of a photonic package in accordance with some embodiments.
Figure 4B:
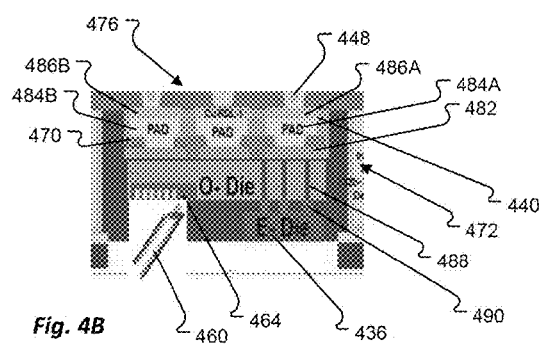

FIG. 4A depicts a cross-section view of a fourth package 400 in accordance with embodiments of the present disclosure. FIG. 4B depicts an enlarged portion of the fourth package 400 depicted in FIG. 4A. Similar to the first package 104, the second package 200, and the third package 300, the fourth package 400 may utilized integrated circuit packaging techniques. The fourth package may include a substrate 404. The substrate 404 may include a mold material, silicon material and/or other generally insulative or semiconductor material. The package 400 may include a protective layer 412 formed on top of, directly contacting, and/or disposed on the substrate 404. The protective layer 412 may include Polyimide and/or Polybenzoxazole material. The protective layer 412 may be a stress relief coatings used as a protective layer or "buffer coat" before packaging or redistribution layer 452. Prior to the forming of the protective layer 412, one or more redistribution layers 408 may be formed on top, directly, contacting, and/or disposed on at least a portion of the substrate 404. Another protective layer 416 may be formed on at least a portion of the protective layer 412 and the redistribution layer 452. In some embodiments, one or more vias 418 may be formed within the protective layers 416 and/or 412. In some instances, a first via may be formed after the formation of the first protective layer 412, while a second via may be formed after the formation of the second protective layer 416. Alternatively, or in addition, a first and/or second via may be formed after the protective layers 412 and 416 have been formed. For example, one or more portions of the protective layer 416 may be removed; for instance the one or more portions may be etched, drilled, or and/or exposed to light to form a first hole in the protective layers 412 and/or 416. An insulating material may then be placed within the first hole to line the sides of the hole. Finally, a conductive material may be placed in the hole thereby forming one or more vias 418.

The package 400 may include one or more redistribution layers 420 formed on, on top of, directly contacting, or otherwise disposed on the protective layer 416. In one embodiment, a protective layer 424 may be formed on, on top of, directly contacting, or otherwise disposed on the protective layer 416. One or more portions of the protective layer 424 may be removed. For example, the one or more portions may be etched, drilled, exposed to light etc., and thereby forming a hole in the protective layer 424. Then a redistribution layer 420 may be formed within the one or more holes of the redistribution layer 420. Lastly, one or more under bump metallization layers 428 may be formed on the redistribution layer 424; the one or more under bump metallization layers 428 may be configured to receive a sold ball and/or connector 432A-C to form a ball grid array for example.

As previously discussed the package 400 may include a redistribution layer 408; the redistribution layer 408 may provide a signal path from one or more of the optical dies (oDies) 440 and/or one or more eDies 436 via an interface portion 476 to one or more of the connectors 432A-432C. The connection portion may include one or more of the redistribution layers 486A and/or 486B, one or more pads 484A and 484B, one or more conductive portions 470, and one or more insulative portions 482. A through insulator via (TIV) 472 (or through integrated circuit package via) may be formed in the substrate 404. The TIV 472 may couple the redistribution layer 408 to a backside redistribution layer 446 for example. The backside redistribution layer 446 may couple the redistribution layer 408 to one or more redistribution layers 452 for example. Accordingly, a via 448 coupling the redistribution layer 452 to one or more redistribution layers 486A and/or 486B may be formed. The redistribution layer 468A and/or 486B may be formed directly on, or otherwise disposed on a pad 484A and/or 484B. The pad 484A and/or 484B may be disposed within an insulative portion 482 including an insulating material; accordingly, one or more of the pads 484A and/or 484B may be coupled to the oDie 440 via a connector portion 470.

The oDie 440 may be coupled to an optical interconnect 464 which may be configured to receive light from a fiber 460 and/or forward the light to a detector portion of the oDie 440. Thus, an opening may be exist at a fiber array receiving side of the package 400. The oDie 440 may convert the light into one or more electric signals and transmit or otherwise provide the one or more electric signals to the eDie 436 and/or an external connection, such as one or more of the connectors 432A-C. The one or more electric signals may be transmitted through the package 400 via one or more of the redistribution layers, the one or more vias, the one or more TIVs, one or more pads 484A and/or 486, and one or more connector portions 470.

In accordance with some embodiments of the present disclosure, the oDie 440 and the eDie 436 may reside within the package 400. For example, a cavity, hole, or other portion may be formed or otherwise exist in the substrate 404. Each of the one or more oDies 440 and/or the one or more eDies 436 may reside between TIVs on either side for example in a cross-section view. Further, the substrate material 404 may include or otherwise be an epoxy such that the substrate material may be between one or more of the eDies 436, the oDies 440 and the one or more TIVs. In some embodiments, the oDie 440 may be directly connected to or otherwise be disposed on one or more of the connector portions 470 and the insulative portion 482.

As further depicted in FIGS. 4A-3B, the oDie 440 may be located between the eDie 436 and the insulative portion 482. Accordingly, the eDie 436 may be coupled to the oDie 440 utilizing one or more bumps 490. One or more vias 488 may facilitate the oDie 440 connection to the connector portion 470 and/or the eDie 436. In accordance with at least one example, the eDie 436 may be flip-chip bonded to the oDie 440 while the package 400 employs integrated circuit packaging technologies.

Figures 5A, 5B:
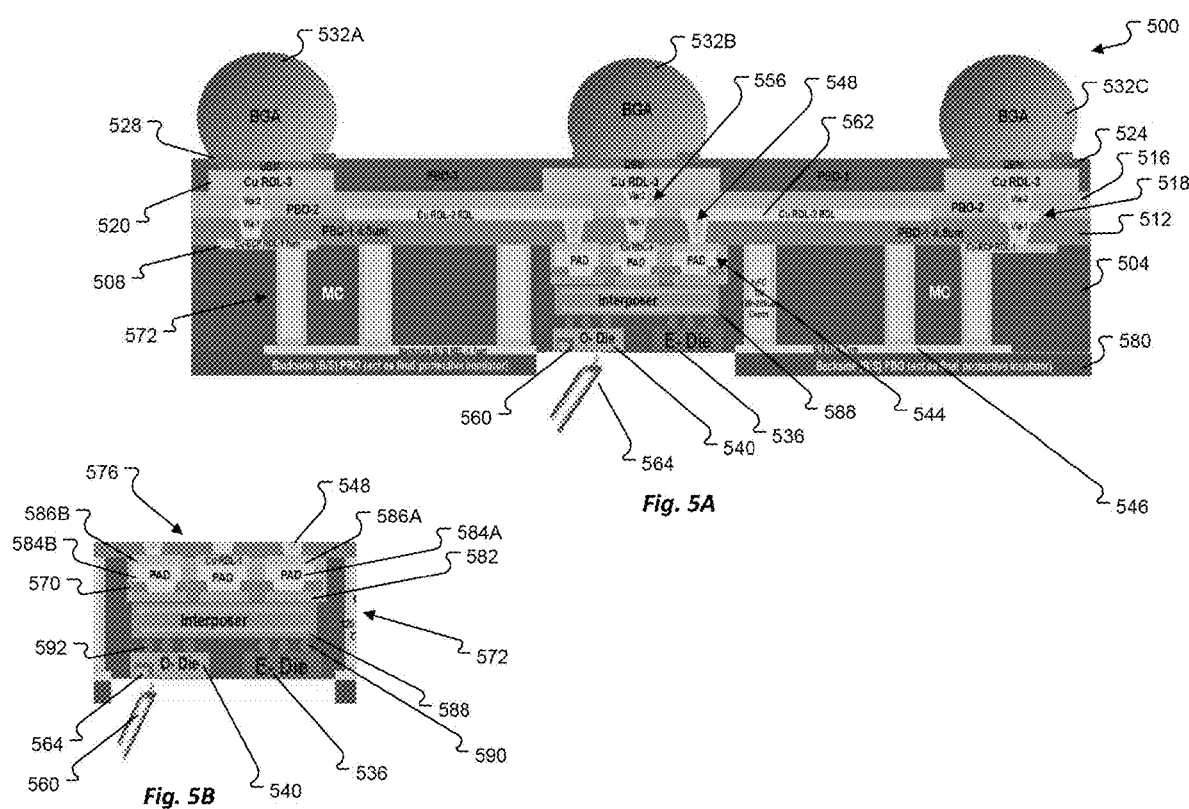
FIGS. 5A-5B depict cross-sectional views of a fifth example of a photonic package in accordance with some embodiments.

FIG. 5A depicts a cross-section view of a fifth package 500 in accordance with embodiments of the present disclosure. FIG. 5B depicts an enlarged portion of the fifth package 500 depicted in FIG. 5A. Similar to the first package 104, the second package 200, the third package 300, and the fourth package 400, the fifth package 500 may utilized integrated circuit packaging techniques. The fifth package may include a substrate 504. The substrate 504 may include a mold material, silicon material and/or other generally insulative or semiconductor material. The package 500 may include a protective layer 512 formed on top of, directly contacting, and/or disposed on the substrate 504. The protective layer 512 may include Polyimide and/or Polybenzoxazole material. The protective layer 512 may be a stress relief coatings used as a protective layer or "buffer coat" before packaging or redistribution layer 552. Prior to the forming of the protective layer 512, one or more redistribution layers 508 may be formed on top, directly, contacting, and/or disposed on at least a portion of the substrate 504. Another protective layer 516 may be formed on at least a portion of the protective layer 512 and the redistribution layer 552. In some embodiments one or more vias 518 may be formed within the protective layers 516 and/or 512. In some instances, a first via may be formed after the formation of the first protective layer 512, while a second via may be formed after the formation of the second protective layer 516. Alternatively, or in addition, a first and/or second via may be formed after the protective layers 512 and 516 have been formed. For example, one or more portions of the protective layer 516 may be removed; for instance the one or more portions may be etched, drilled, or and/or exposed to light to form a first hole in the protective layers 512 and/or 516. An insulating material may then be placed within the first hole to line the sides of the hole. Finally, a conductive material may be placed in the hole thereby forming one or more vias 518.

The package 500 may include one or more redistribution layers 520 formed on, on top of, directly contacting, or otherwise disposed on the protective layer 516. In one embodiment, a protective layer 524 may be formed on, on top of, directly contacting, or otherwise disposed on the protective layer 516. One or more portions of the protective layer 524 may be removed. For example, the one or more portions may be etched, drilled, exposed to light etc., and thereby forming a hole in the protective layer 524. Then a redistribution layer 520 may be formed within the one or more holes of the redistribution layer 520. Lastly, one or more under bump metallization layers 528 may be formed on the redistribution layer 520; the one or more under bump metallization layers 528 may be configured to receive a sold ball and/or connector 532A-C to form a ball grid array for example.

As previously discussed the package 500 may include a redistribution layer 508; the redistribution layer 508 may provide a signal path from one or more of the optical dies (oDies) 540 and/or one or more eDies 536 via an interface portion 576 to one or more of the connectors 532A-532C. The connection portion may include one or more of the redistribution layers 586A and/or 586B, one or more pads 584A and 584B, one or more conductive portions 570, and one or more insulative portions 582. A through insulator via (TIV) 572 may be formed in the substrate 504. The TIV 572 may couple the redistribution layer 508 to a backside redistribution layer 546 for example. The backside redistribution layer 546 may couple the redistribution layer 508 to one or more redistribution layers 552 for example. Accordingly, a via 548 coupling the redistribution layer 552 to one or more redistribution layers 586A and/or 586B may be formed. The redistribution layer 568A and/or 586B may be formed directly on, or otherwise disposed on a pad 584A and/or 584B. The pad 584A and/or 584B may be disposed within an insulative portion 582 including an insulating material; accordingly, one or more of the pads 584A and/or 584B may be coupled to an interposer 588 which may couple the oDie 540 and eDie 536 to the connector portion 570.

The oDie 540 may be coupled to an optical interconnect 564 which may be configured to receive light from a fiber 560 and/or forward the light to a detector portion of the oDie 540. Thus, an opening may be exist at a fiber array receiving side of the package 500. The oDie 540 may convert the light into one or more electric signals and transmit or otherwise provide the one or more electric signals to the eDie 536 and/or an external connection, such as one or more of the connectors 532A-C. The one or more electric signals may be transmitted through the package 500 via one or more of the redistribution layers, the one or more vias, the one or more TIVs, one or more pads 584A and/or 586, and one or more connector portions 570.

In accordance with some embodiments of the present disclosure, the oDie 540 and the eDie 536 may reside within the package 500 together with an interposer 588. For example, a cavity, hole, or other portion may be formed or otherwise exist in the substrate 504. Each of the one or more oDies 540, the one or more eDies 536, and the interposer 588 may reside between TIVs on either side for example in a cross-section view. Further, the substrate material 504 may include or otherwise be an epoxy such that the substrate material may be between one or more of the eDies 536, the oDies 540, and the one or more TIVs. In some embodiments, the oDie 540 and the eDie 536 may be connected to the interposer 588 with one or more bumps 590 and 592, while the interposer 588 is directly connected to or otherwise be disposed on the one or more of the connector portions 570 and the insulative portion 582. As further depicted in FIGS. 5A-5B, the interposer 588 may be located between the oDie 540 and/or eDie 536 and the insulative portion 582. In accordance with at least one example, the eDie 536 and/or the oDie 540 may be flip-chip bonded to the interposer 588 in the package 500 that employs integrated circuit packaging technologies.

Figure 6:
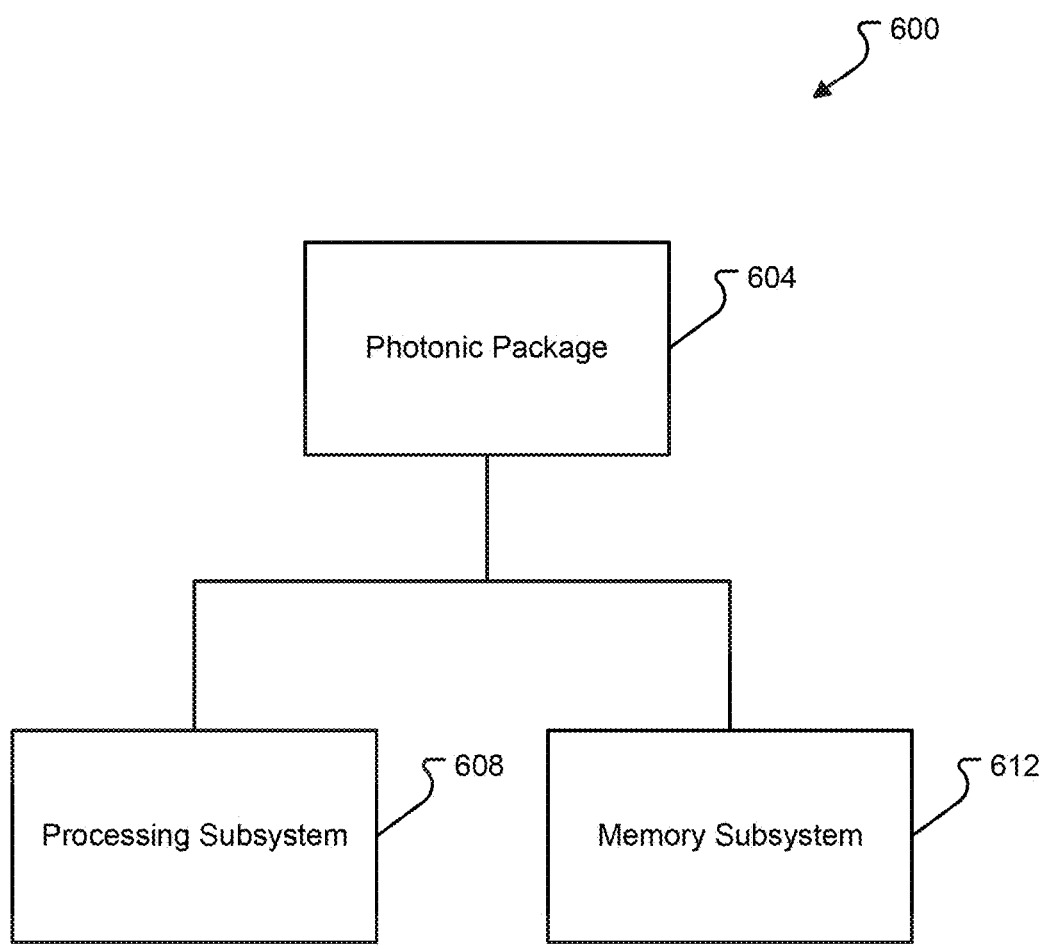
FIG. 6 depicts a system incorporating a photonic package in accordance with some embodiments.

One or more of the preceding embodiments of the package illustrated in FIGS. 1-5B may be included in a system or device. More specifically, FIG. 6 illustrates a system 600 that includes photonic package(s) 604. The system 600 also includes a processing subsystem 608 (with one or more processors) and a memory subsystem 612 (with memory).

In general, the system 600 may be implemented using a combination of hardware and/or software. Thus, system 600 may include one or more program modules or sets of instructions stored in a memory subsystem 612 (such as DRAM or another type of volatile or non-volatile computer-readable memory), which, during operation, may be executed by processing subsystem 608.

The system 600 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, the photonic package 604 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Figure 7:
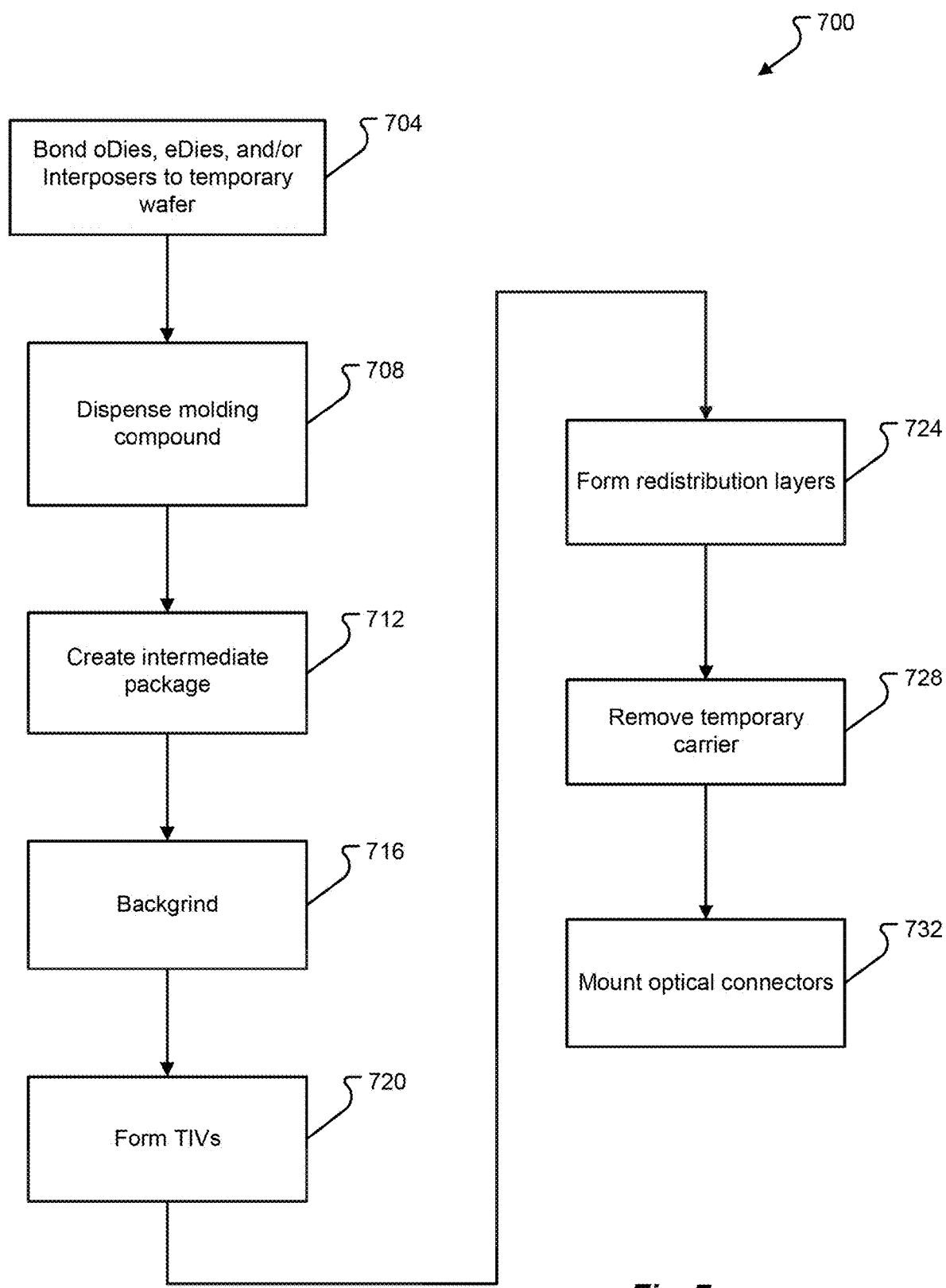
FIG. 7 depicts a flowchart of a method for forming a photonic package in accordance with some embodiments.

FIG. 7 is a flowchart of a first example method for forming a photonic package in accordance with some embodiments. In one embodiment, the process of FIG. 7 can be used to construct the photonic package shown in FIGS. 1-5B. First, one or more oDies 116, eDies 108, and/or interposers 588 are bonded together in step 704 such that the resulting orientation results in an active-surface down. For example, one or more oDies, eDies, and/or interposers are bonded together as indicated in FIGS. 1-5B. Flip-chip bonding techniques may be applied to bond the one or more oDies, eDies, and/or interposers. The resulting bonded dies and/or interposers are secured to a temporary carrier wafer, which may include one or more connection sections, using a temporary adhesive. An intermediate package is formed by dispensing a molding compound in step 708 to encapsulate the oDies, eDies, and/or the interposer, and compression and curing operations may be performed on the dispensed molding compound to create the intermediate package in step 712. A back-grinding operation may be performed on the intermediate package in step 716 to reveal backsides of the oDies, eDies, and/or interposer. In step 720, through insulator vias (TIVs) are formed in the intermediate package. A redistribution layer (RDL) 220 is formed on one or more portions of a surface exposed by the back-grinding operation in step 724, wherein the RDL facilitates routing signals from the vias to solder balls. In some embodiments, one or more pads, additional RDLs, and more protection layers may be formed. The temporary carrier wafer is removed in step 728, and the resulting intermediate package is flipped over to expose the active surfaces of the oDies and/or eDies. In step 732, one or more optical connectors containing optical waveguides may be mounted to the intermediate package, so that the optical waveguides are optically coupled to the oDie.

Figure 8A:
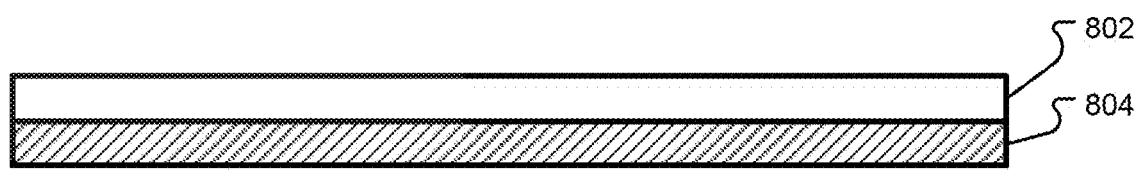
FIGS. 8A-8P illustrate steps of a process for manufacturing a photonic package in accordance with some embodiments.
Figure 8B:
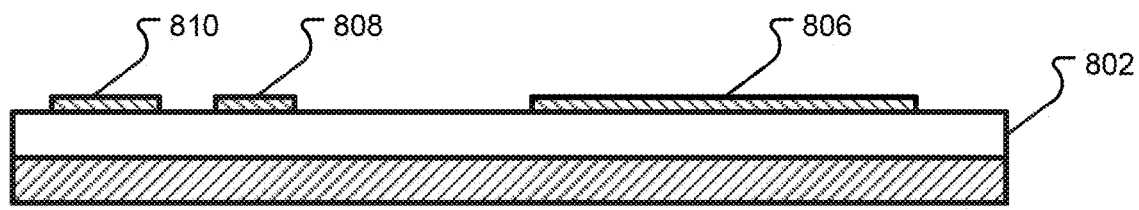
Figure 8C:
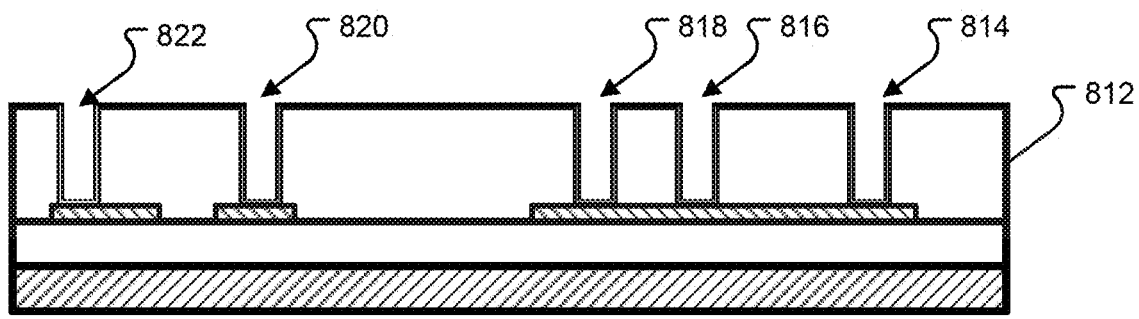
Figure 8D:
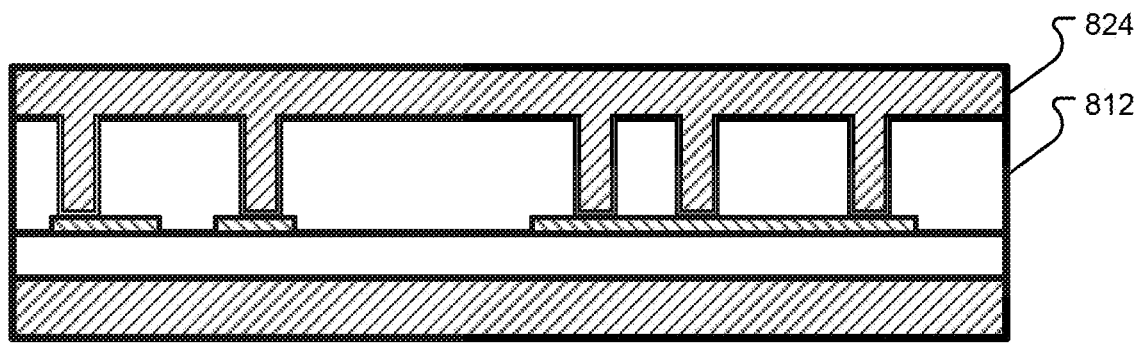
Figure 8E:
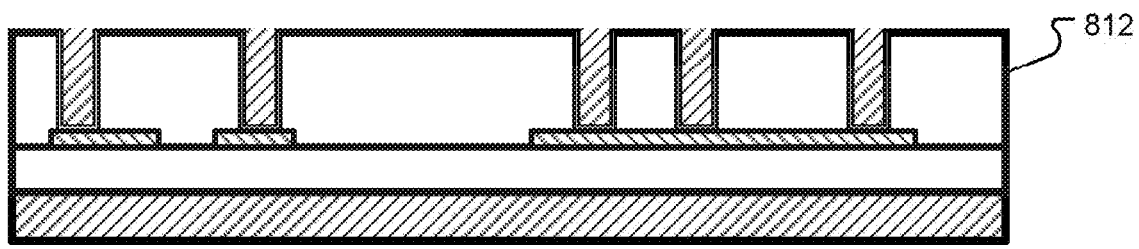
Figure 8F:
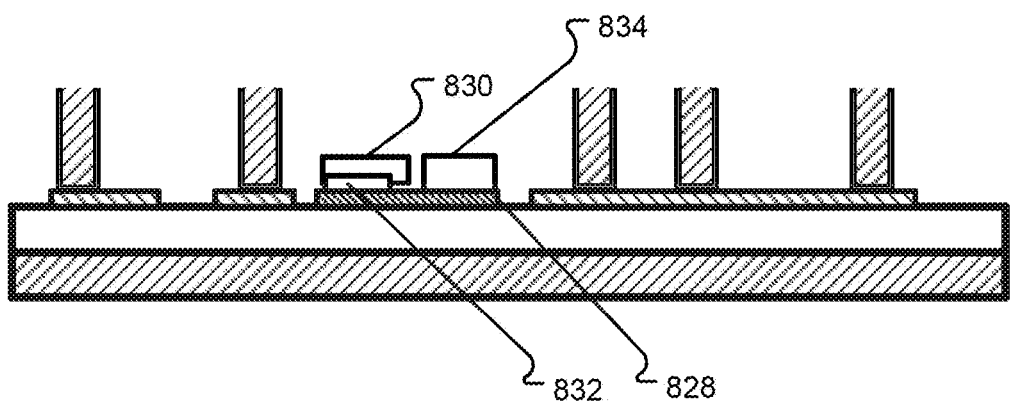
Figure 8G:
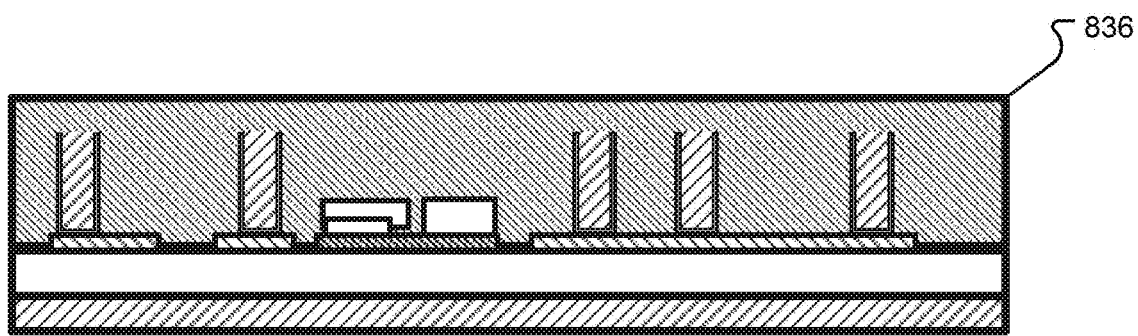
Figure 8H:
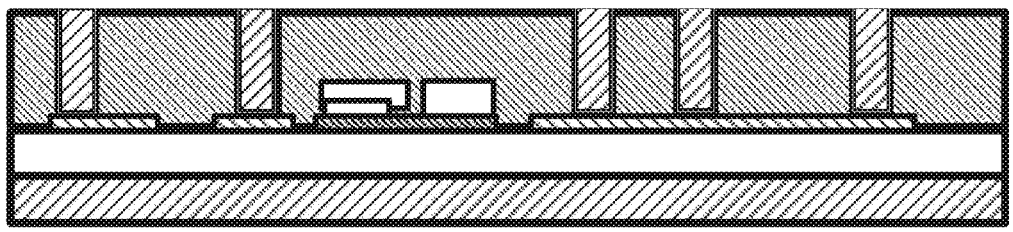
Figure 8I:
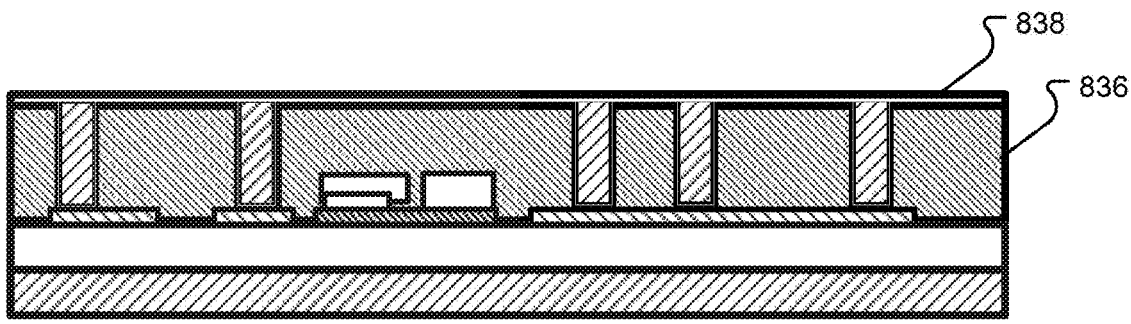
Figure 8J:
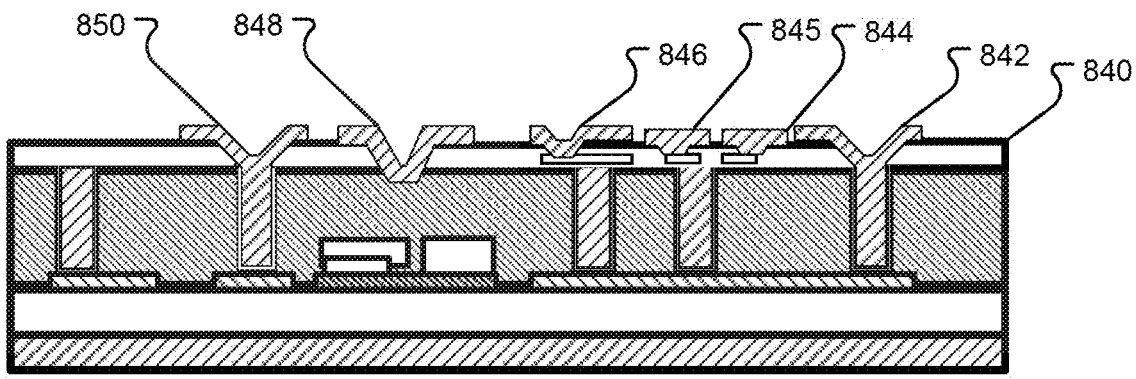
Figure 8K:
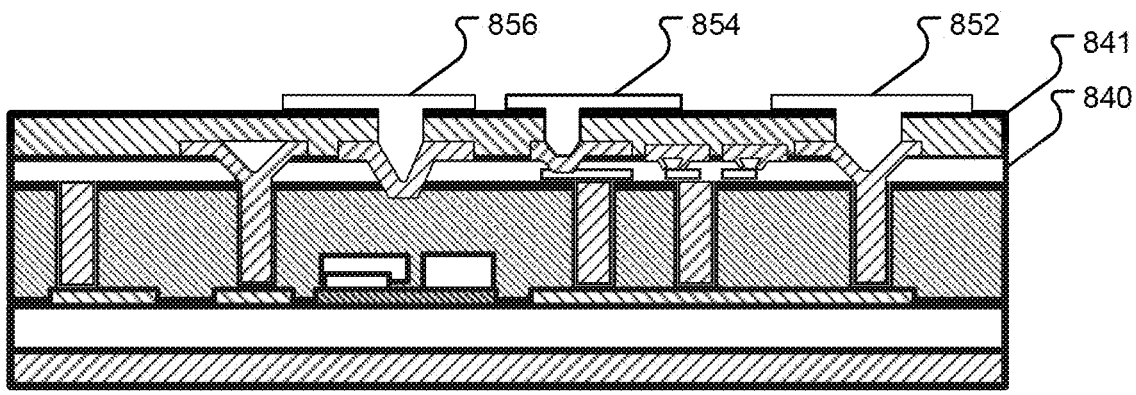
Figure 8L:
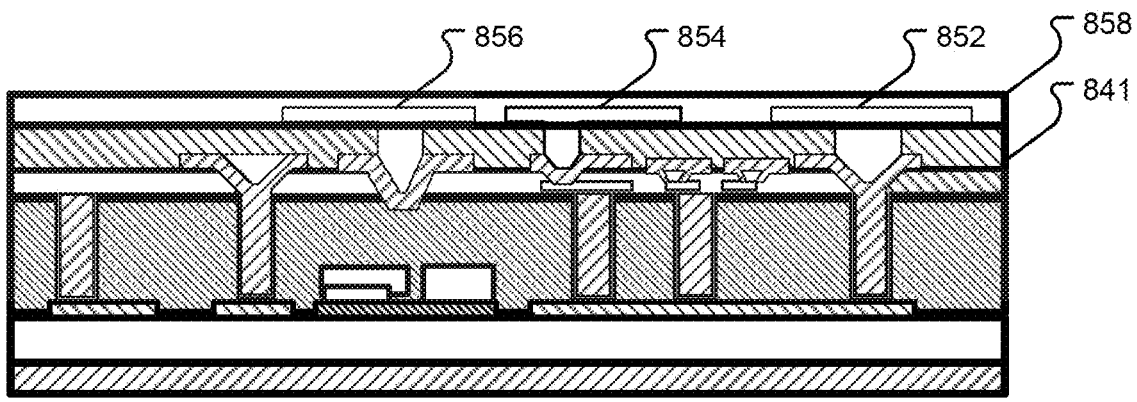
Figure 8M:
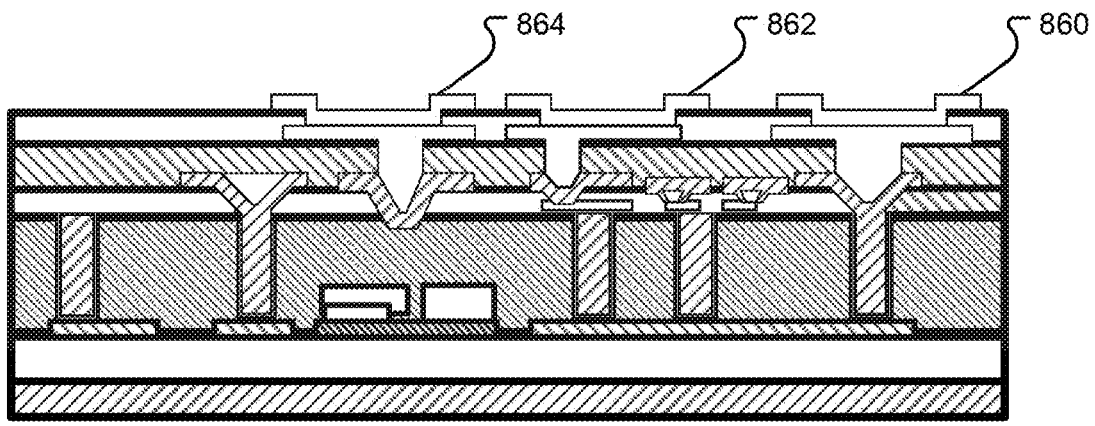
Figure 8N:
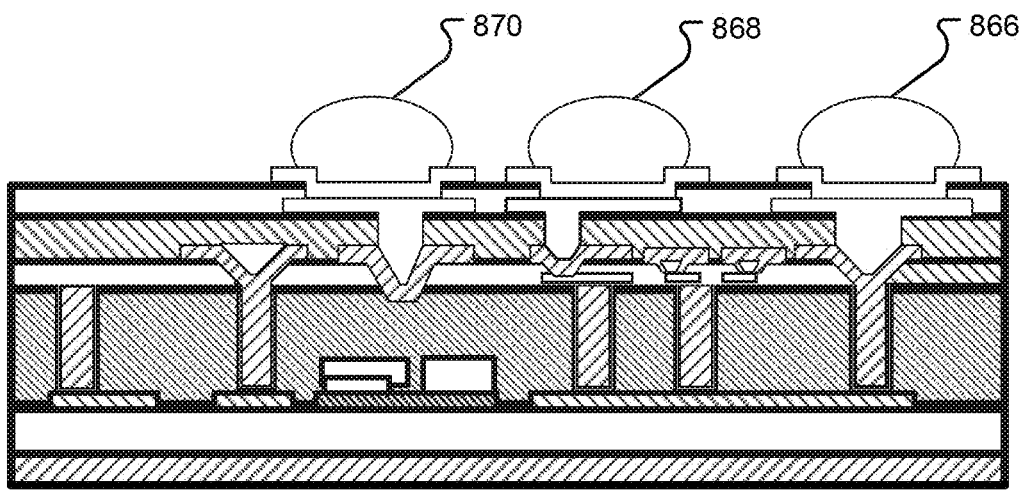
Figure 8O:
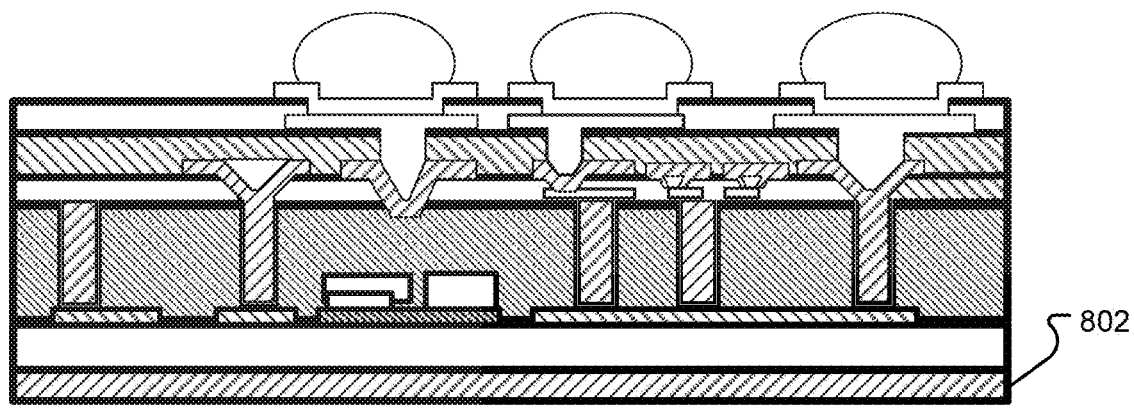
Figure 8P:
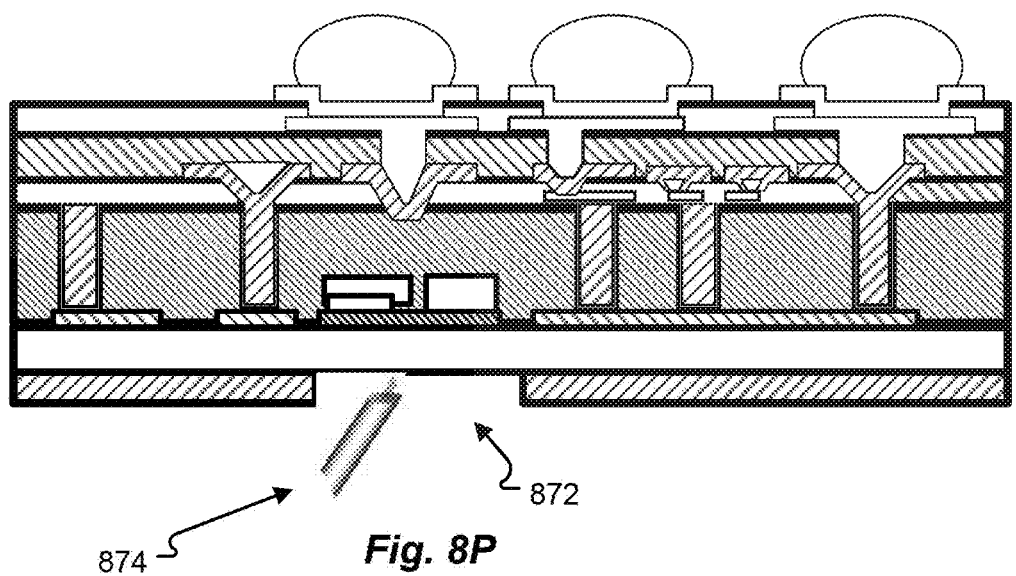

FIGS. 8A-8P depict an example manufacturing process for manufacturing a photonic package in accordance with some embodiments. While steps 8A-8P are depicted as being separate steps, it should be understood that one or more steps may be combined with another step and/or divided into multiple additional steps. The manufacturing process may start at FIG. 8A where a film 802, for example a PBO film, may be applied to carrier substrate, such as a glass carrier substrate 804. The film 802 may be applied via a light transfer heat conversion process as one example. In accordance with embodiments of the present disclosure, the film 802 is applied to a backside of the glass carrier substrate 804, as will be apparent from the manufactured photonic package. At FIG. 8B, a seeding layer, for example of Ti/Cu may be applied to the film 804, followed by a conducting layer together with a photo patterning and wet acid etching to form the redistribution layers (RDL) 806, 808, and 810. The seeding layer Ti/CU may be 1 K/5 KA thick and the conducting layer may be 7 μm thick for example. Of course, other thicknesses of the Ti/CU layer are contemplated. At FIG. 8C, a photoresist layer 812 may be applied to the film 802 and/or the RDLs 806, 808, and 810. The photoresist layer 812 may be 180-250 μm thick for example. Of course, other thicknesses of the photoresist layer 812 are contemplated. After the application of the photoresist layer 812, one or more through insulator vias (TIV) 814, 816, 818, 820, and 822 may be created in the photoresist layer 812. The TIVs 814, 816, 818, 820, and 822 are examples of TIVs that may be created; more or less TIVs are contemplated herein as is the location, orientation, and sizing. For example, the TIVs may include a 12 lam diameter hole. Each of the holes may or may not include an insulative portion lining the inside of the hole. In some instances, the insulative portion may only line a portion of the hole. In some instances, the insulative portion may not be present.

At FIG. 8D, the holes may be filled with a conductive material 824. The conductive material 824 may include copper or other conductive material. In some instances, the conductive material 824 may be formed using an electrochemical plating process, such as but not limited to Cu-ECP. At FIG. 8E, the excess copper may be removed exposing the photoresist layer 812. The excess copper may be removed using a chemical mechanical planarization (Cu-CMP) process for example. Of course, other removal processes are contemplated. At FIG. 8F, the photoresist layer 812 may be stripped leaving the TIVs. Further, a die attach film (DAF) 828 may be utilized to secure the optical interconnect 832, O-Die 830, and the E-Die 834. The O-Die 830, E-Die 834, and optical interconnect 832 may be same as or similar to the previously described O-Die, E-Die, and optical interconnects previously described herein. In some instances, the DAF 828 may be pre-glue to known good dies and placed with a pick and place unit. In some examples, the DAF 828 may be 10 pick and place utilizing known good dies. In some examples, the DAF 828 may be less than or greater than 10 μm thick. At FIG. 8G, an over molding compound (MC) 836 may be applied; the MC 836 may be 50 μm thick; in some examples, the MC 836 may be less than or greater than 50 μm thick. As depicted in FIG. 8H, the excess MC 836 may be removed; for example, the excess MC 836 may be removed via grinding and/or chemical mechanical planarization.

In accordance with embodiments, a conductive material 838 may be applied to the surface of the MC 836. In some examples, the conductive material 838 may be the same as or similar to the conductive material 824. In some examples, an electrochemical plating process, such as but not limited to Cu-ECP, may be utilized. The conductive material 824 may be electrically coupled to the conductive material 824, and in some instances, one or more of the RDLS 806, 808, and 810. As depicted in FIG. 8J, one or more portions of the conductive material 838 may be removed and a protective layer 840 may be formed on top of the MC 836 and the one or more portions of the conductive material 838. In some examples, the conductive material 838 may 7 μm thick. In some examples, the protective layer 840 may be 4.5 μm thick; in other examples, the protective layer 840 may be less than or greater than 4.5 μm thick in thickness. The protective layer may be the same as or similar to the protective layers, such as but not limited to protective layer 412, previously described. In some examples, the protective layer 840 may include PBO material.

As depicted in FIG. 8J, some examples may include RDLs 842, 844, 846, 848, and 850. The RDLs 842, 844, 845, 846, 848, and 850 may include conductive material, such as copper, and a process, such as but not limited to a Cu-ECP patterning process may be utilized. As depicted in FIG. 8K, a protective layer 841 may be applied to the protective layer 840 and one or more portions of the RDLs 842, 844, 846, 848, and 850. In accordance with some examples, conductive material forming RDLs 852, 854, and 856 may be patterned onto the protective layer 841. As depicted in FIG. 8L, another protective layer 858 may be provided on the protective layer 840 and the RDLS 852, 854, and 856. The protective layer 858 may be a PBO layer. The RDLS 852, 854, and 856 may be applied utilizing a photomasking and patterning process, and then followed by an etching process, such wet acid etching. In some examples, the protective layer 858 may be applied via spin coating. FIG. 8M depicts under bump mounts (UBM) 860, 862, and 864. The UBMs 860, 862, and 864 may be applied using a photomask patterning process followed by an etching, such as but not limited to wet acid etching, process. The UBMs 860, 862, and 864 may then be deposited; in some examples, the UBMs 860, 862, and 864 may be copper, and may be deposited utilizing a Cu-ECP process. As depicted in FIG. 8N, the bumps 866, 868, and 870 may be formed on top of the corresponding UBMs 860, 862, and 864.

As depicted in FIG. 8O, the glass carrier 804 may be removed after UV exposure to LTHC, where the protective layer 802 acts as a final protective layer for the assembled package. As depicted in FIG. 8P, a portion 872 of the backside region may be removed to accommodate the fiber array 874. Although the manufacturing process has been illustrated utilizing a plurality of steps, such steps and/or the order of such steps should not be considered limiting.

In one embodiment, an integrated fan-out (InFO) package is provided as an integrated circuit package; the integrated circuit package may include a photonics die (oDie) including at least one optical component, an electronics die (eDie), and a molded portion, wherein the molded portion includes a plurality of redistribution layers communicatively coupled to at least one of the oDie and/or the eDie, and wherein the molded portion at least partially surrounds the at least one of the oDie and/or the eDie.

In another embodiment, a package comprising a photonics die (oDie) including at least one optical component and an electronics die (eDie) is provided. The package may include a molded portion having first and second sides, where the molded portion includes one or more redistribution layers coupling at least one of the oDie and/or the eDie located with the molded portion at the first side of the package to a conduction portion located at the second side of the package.

In some embodiments, a method for producing an integrated circuit package, such as a fan out (InFO) package is provided. The method may include electrically coupling at least one optical die (oDie) to an electronic die (eDie), forming an intermediate package including a molded portion around a portion of the oDie and a portion of the eDie, and removing at least a portion of the molded portion. Then, at least one redistribution layer may be formed at a location of the molded portion corresponding to the removed portion and at least one protection layer may be formed on the at least one redistribution layer, wherein the at least one redistribution layer located between the molded portion and a first side of the integrated circuit package couples at least one of the oDie and/or the eDie to a conductive portion located at the first side of the of the integrated circuit package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out circuit package, comprising:
   a discrete photonics die (oDie) including at least one optical component and an optical interconnect situated at a backside of the oDie;
   an electronics die (eDie);
   a substrate including a plurality of redistribution layers electrically coupled to the oDie and the eDie, wherein the substrate includes a molded portion that at least partially surrounds the oDie and the eDie;
   a backside redistribution layer at a backside of the molded portion and at least one through insulator via (TIV) located within the molded portion and coupling the plurality of redistribution layers to the backside redistribution layer;
   a connection portion electrically coupling the oDie and the eDie to at least one of the plurality of redistribution layers; and
   an opening at a backside of the integrated fan-out circuit package exposing the optical interconnect.

2. The integrated fan-out circuit package of claim 1, further comprising a protective layer disposed on the backside redistribution layer.

3. The integrated fan-out circuit package of claim 2, wherein the protective layer comprises any one of (i) Polyimide, (ii) Polybenzoxazole, or (iii) a combination of (i) and (ii).

4. The integrated fan-out circuit package of claim 1, wherein the optical interconnect is optically coupled to at least one optical fiber via the opening.

5. The integrated fan-out circuit package of claim 1, wherein the oDie and the eDie are disposed between a first TIV and a second TIV of the at least one TIV.

6. The integrated fan-out circuit package of claim 1, wherein the oDie is disposed between the eDie and the connection portion.

7. The integrated fan-out circuit package of claim 6, wherein the oDie is coupled to eDie via one or more vias and one or more bumps.

8. The integrated fan-out circuit package of claim 1, wherein the eDie is disposed between the oDie and the connection portion.

9. The integrated fan-out circuit package of claim 8, wherein the eDie is coupled to the oDie via one or more vias and one or more bumps.

10. The integrated fan-out circuit package of claim 1, further comprising an interposer disposed between any one of (i) the oDie and the connection portion, (ii) the eDie and the connection portion, or (iii) both (i) and (ii).

11. The integrated fan-out circuit package of claim 1, further comprising one or more protective layers disposed on any one of (i) at least a portion of the substrate, (ii) at least a portion of one or more distribution layers of the plurality of redistribution layers, (iii) at least a portion of a different protective layer, or (iv) any combination of (i)-(iii).

12. The integrated fan-out circuit package of claim 11, further comprising one or more vias formed within the one or more protective layers.

13. A package comprising:
- a discrete photonics die (oDie) including at least one optical component and an optical interconnect situated at a backside of the oDie;
- an electronics die (eDie);
- a molded portion having a front side and a backside, the oDie and the eDie located within the molded portion;
- a connection portion located within the molded portion and at the front side of the molded portion, the oDie and eDie electrically coupled to the connection portion;
- one or more redistribution layers located at the front side of the molded portion and electrically coupled to the connection portion;
- a backside redistribution layer at the backside of the molded portion and at least one through insulator via (TIV) located within the molded portion and coupling the one or more redistribution layers to the backside redistribution layer; and
- an opening at the backside of the molded portion exposing the optical interconnect.

14. The package of claim 13, further comprising a protective layer disposed on the backside redistribution layer.

15. The package of claim 13, wherein the oDie is disposed between the eDie and the connection portion.

16. The package of claim 13, wherein the eDie is disposed between the oDie and the connection portion.

17. The package of claim 13, further comprising an interposer disposed between any one of (i) the oDie and the connection portion, (ii) the eDie and the connection portion, or (iii) both (i) and (ii).

18. The package of claim 13, wherein the optical interconnect is optically coupled to at least one optical fiber via the opening.

19. An integrated circuit package comprising:
- a molded portion having a front side and a backside;
- a discrete photonics die (oDie) configured to be optically connected to an optical fiber with an optical interconnect situated at a backside of the oDie, the oDie located within the molded portion and at the backside of the molded portion;
- an electronics die (eDie) located within the molded portion;
- a connection portion located within the molded portion and at the front side of the molded portion, wherein the oDie and eDie are electrically coupled to the connection portion;
- one or more redistribution layers located at the front side of the molded portion and electrically coupled to the connection portion;
- a backside redistribution layer at the backside of the molded portion and at least one through insulator via (TIV) located within the molded portion and coupling the one or more redistribution layers to the backside redistribution layer; and
- wherein the molded portion includes an opening at the backside of the molded portion, and the opening exposes the optical interconnect.

20. The integrated circuit package of claim 19, wherein the molded portion comprises a molding compound.

* * * * *